(12) United States Patent
Matsuta et al.

(10) Patent No.: US 6,276,995 B1
(45) Date of Patent: Aug. 21, 2001

(54) ELECTRONIC COMPONENT AND METHOD OF MANUFACTURING SAME

(75) Inventors: Katsuji Matsuta, Sabae; Kazuyoshi Uchiyama; Masahiko Kawaguchi, both of Takefu; Katsuhiro Misaki, Fukui; Naoki Iida, Sabae, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/090,367

(22) Filed: Jun. 4, 1998

(30) Foreign Application Priority Data

Jun. 10, 1997 (JP) .................................... 9-169520

(51) Int. Cl.$^7$ ...................................... B24B 1/00
(52) U.S. Cl. ...................... 451/41; 125/12; 125/13.01; 125/15; 125/22
(58) Field of Search .................. 83/886, 875; 451/41; 125/12, 13.01, 15, 22

(56) References Cited

U.S. PATENT DOCUMENTS 4,217,689 * 8/1980 Fujii et al. ........................ 125/13.01

5,600,101   2/1997 Sakai .
5,836,229 * 11/1998 Wakayama et al. .................... 83/886

FOREIGN PATENT DOCUMENTS

494992 * 3/1930 (DE) ....................................... 125/15
43 06 655 A1 9/1993 (DE) .
289325 * 5/1889 (FR) ....................................... 125/15

* cited by examiner

*Primary Examiner*—M. Rachuba
(74) *Attorney, Agent, or Firm*—Keating & Bennett, LLP

(57) ABSTRACT

A method of manufacturing an electronic component provides a wide area which can be used for forming elements on the surface of a mother substrate and effectively produces an electronic component having excellent performance characteristics. At least a portion of the mother substrate is cut by using a blade having a shape in which a portion thereof butted against the boundary (shoulder) between the electrode arrangement surface and the cut end surface of the mother substrate or a portion which becomes the boundary (shoulder) is inclined at a predetermined angle to form an inclined surface at the boundary (shoulder) or the portion which becomes the boundary (shoulder) so as to expose a part of an electrode at the inclined surface.

16 Claims, 8 Drawing Sheets

ELECTRONIC COMPONENT AND METHOD OF MANUFACTURING SAME

BACKGROUND OF THE INVENTION

1. Field of the Invention

The present invention relates to a method of manufacturing an electronic component, and particularly to a method of manufacturing an electronic component including the step of cutting, along predetermined cutting lines, a mother substrate, having an electrode arrangement which is surface coated with a coating material, so as to obtain an electronic component device having an electrode which is exposed at a cut end surface.

2. Description of the Related Art

A chip type coil component including a thin film coil pattern (conductor pattern) disposed on the surface of a substrate is manufactured via a process including a step of cutting, at predetermined positions, a mother substrate 53 including a plurality of thin film coil patterns 51 disposed thereon and having a surface coated with an insulating protective film (coating material) 52, so as to obtain elements 54, for example, as shown in FIG. 9.

The insulating protective film 52 is made of, for example, a resin material such as polyimide or the like to provide surface smoothness, insulation quality, heat resistance, and adaptability for fine processing required for miniaturization of a chip component.

A known method of cutting the mother substrate 53 at the predetermined positions into individual components 54 includes a breaking step using a scriber. However, this method uses a cleavage function, and thus coating of the insulating protective film 52 on scribing lines makes cutting impossible, and requires cutting margins 55 (FIG. 9) to be provided around the insulating protective film 52.

In a chip type electronic component requiring miniaturization, particularly a chip type coil component having a conductor pattern such as a thin film coil pattern provided on the surface of a substrate, in order to maintain and improve performance, it is critical to ensure a large area for forming the conductor pattern. However, with the above scribe breaking technique for cutting the mother substrate, it is very difficult to ensure an area that is sufficient for the formation of the conductor pattern. Therefore, it is impossible to sufficiently satisfy the requirement for miniaturization.

Another known method of cutting the mother substrate at the predetermined positions into the respective components includes a step of cutting the mother substrate by using a dicing blade. This dicing method has excellent processing accuracy and is capable of cutting the insulating protective film 52 at the same time, thereby eliminating the need for the cutting margins. It is thus possible to form the insulating protective film 52 over the entire surface of the mother substrate, as shown in FIG. 10. The dicing method thus has the advantage that the conductor pattern 51 can be formed up to the periphery of a chip, and a wide area can be used for forming elements, as compared with the scribe breaking method.

Recently, in order to maximize the use of the substrate surface, the insulating protective film has been formed over substantially the whole area of the substrate, as shown in FIG. 10, and a connecting electrode 58 connected to an external terminal has been arranged at the end of each of the components 54 and exposed from the cut end surface by cutting (dice cutting) using a dicing blade so as to be positioned to be easily connected to an external electrode.

However, a chip type coil component in which the conductor pattern such as the thin film coil pattern is disposed on the surface of the substrate has recently been required to have characteristics for radio frequencies. Thus, it has been essential to decrease the dielectric constant of the material of the substrate. Therefore, the substrate made must be made of low-dielectric-constant materials such as glass, glass ceramics, composite mica ceramics, ferrite, and the like. However, such low-dielectric-constant materials experience chipping, cracking or peeling in the substrate below the connecting electrode in the cut plane due to cutting impact which causes deterioration in reliability due to poor connection with the external electrode or open failure due to peeling between the substrate and the connecting electrode.

FIGS. 11A and 11B are schematic drawings each showing a state wherein chipping C and peeling D occur when the mother substrate 53 with the surface having the conductor pattern 51 (the connecting electrode 58) disposed thereon and covered with the insulating protecting film 52 is cut by dicing.

SUMMARY OF THE INVENTION

To overcome the problems described above, the preferred embodiments of the present invention provide a method of manufacturing an electronic component which ensures a significantly increased and much wider area for forming elements on the surface of a mother substrate and achieves efficient manufacturing of an electronic component having excellent performance characteristics without deteriorating the connection reliability.

In accordance with a preferred embodiment of the present invention, a method of manufacturing an electronic component in which a mother substrate having an electrode arrangement surface covered with a coating material is cut along predetermined cutting lines to obtain electronic components each having an electrode which is exposed from a cut end surface. The method preferably includes the steps of cutting at least a portion of the mother substrate using a blade having a shape in which a portion of the blade which is butted against the boundary (shoulder) located between the electrode surface and the cut end surface of the mother substrate, or a portion of the substrate which becomes the boundary (shoulder), is inclined at a predetermined angle to form an inclined surface at the boundary (shoulder) or the portion which becomes the boundary (shoulder) so as to expose a portion of the electrode at the inclined surface.

In this method, at least a portion of the mother substrate is cut by using a blade having a shape in which a portion of the blade butted against the boundary (shoulder) between the electrode arrangement surface and the cut end surface of the mother substrate, or a portion which becomes the boundary (shoulder), is inclined at a predetermined angle to form an inclined surface in the boundary (shoulder) or the portion which becomes the boundary (shoulder) so as to expose a portion of the electrode at the inclined surface. Therefore, it is possible to increase the exposure area of the electrode, and improve electrical connectability with an external terminal and Q of inductance.

In the preferred embodiments of the present invention, "cutting the mother substrate along cutting lines" is broadly defined to include many methods including a case in which the mother substrate is cut by using a dicing blade, a case in which the mother substrate is cut by scribe breaking using a scriber, and the like.

In the method of manufacturing an electronic component of preferred embodiments of the present invention, the cutting blade may be formed of, for example, a material including a metal binder and diamond particles having a grain size of #200 to #1200. Preferably, a material comprising a metal binder and diamond particles having a grain size of #600 to #1000 is used.

In accordance with another preferred embodiment of the present invention, there is provided a method of manufacturing an electronic component in which a mother substrate having an electrode arrangement surface covered with a coating material is cut along predetermined cutting lines to obtain electronic components each of which has an electrode which is exposed at the cut end surface, the method including the steps forming a groove along each of the predetermined cutting lines by using a blade having a shape in which a portion of the blade which is butted against a portion of the substrate which becomes the boundary (shoulder) between the electrode surface and the cut end surface of the mother substrate is inclined at a predetermined angle to form an inclined surface in the portion which becomes the boundary between the electrode arrangement surface and the cut end surface of the mother substrate and to expose a portion of the electrode at the inclined surface before cutting the mother substrate along the cutting lines; and then cutting the mother substrate along the predetermined cutting lines so as to allow at least a portion of the inclined surface where the electrode is exposed to remain.

In this method, before the mother substrate is cut along the cutting lines, the groove is formed along each of the cutting lines by cutting the portion which becomes the boundary (shoulder) between the electrode arrangement surface and the cut end surface using a blade having a shape in which a portion thereof which is butted against that portion of the substrate is inclined at the predetermined angle to form an inclined surface at the portion which becomes the boundary (shoulder) of the mother substrate and to expose a portion of the electrode at the inclined surface, and then the mother substrate is cut along the cutting lines so as to allow at least the portion of the inclined surface where the electrode is exposed to remain. Therefore, it is possible to increase the area of the electrode which is exposed, and improve the electrical connectability with an external terminal and Q of inductance, as compared with a conventional method in which no inclined surface is formed at the boundary shoulder.

After the grooves are formed, the mother substrate is cut along substantially the center of each of the grooves by using, for example, a dicing blade having a thickness smaller than the width of the grooves. The mother substrate is cut by a predetermined amount to allow the portion of the inclined surface where the electrode is exposed to remain, so as to produce respective electronic components.

In accordance with another preferred embodiment of the present invention, there is provided a method of manufacturing an electronic component in which a mother substrate having an electrode arrangement surface covered with a coating material is cut along predetermined cutting lines to produce electronic components, each of which has an electrode which is exposed at the cut end surface, the method including the steps of cutting the mother substrate along the predetermined cutting lines; and forming an inclined surface in the boundary (shoulder) between the electrode arrangement surface and the cut end surface of the mother substrate by using a blade having a shape in which a portion thereof butted against the boundary (shoulder) of the mother substrate is inclined at a predetermined angle to expose a portion of the electrode at the inclined surface.

In this method, after the mother substrate is cut along the cutting lines, an inclined surface is formed at the boundary (shoulder) between the electrode arrangement surface and the cut end surface of the mother substrate by using a blade having a shape in which a portion thereof butted against the boundary (shoulder) of the mother substrate is inclined to expose a portion of the electrode from the inclined surface. Therefore, it is possible to reliably increase the area where the electrode is exposed, and improve the electrical connectability of the electrode with an external terminal, and Q of inductance, as compared with a conventional method in which no inclined surface is formed at the boundary (shoulder).

The method of manufacturing an electronic component according to preferred embodiments of the present invention preferably uses a dicing blade for cutting the mother substrate.

Since the mother substrate is cut by using a dicing blade (i.e., dice cutting), unlike in the case of scribe cutting, it is unnecessary to provide cutting margins, thereby making it possible to utilize the maximum area of the substrate surface, and making the preferred embodiments of the present invention more effective.

Also the method of manufacturing an electronic component of the preferred embodiments of the present invention uses a dicing blade having a substantially disk shape including a thin portion having a small thickness and formed at a peripheral portion of the blade which is located outside a predetermined position along a radial direction of the blade, a thick portion having a larger thickness than the thin portion and located closer to a central portion of the blade than the thin portion, and an inclined portion located at the boundary between the thin potion and the thick portion so that the mother substrate is cut by the thin portion of the blade, and the boundary (shoulder) of the mother substrate or a portion which becomes the boundary (shoulder) thereof is cut by the inclined portion of the blade to form an inclined surface in the boundary (shoulder) of the mother substrate.

By using the dicing blade including the thin portion, the thick portion and the inclined portion located at the boundary between both portions, it is possible to cut the mother substrate via the thin portion of the blade, and cut the boundary (shoulder) between the electrode arrangement surface and the cut end surface of the mother substrate via the inclined portion of the blade to securely form an inclined surface at the boundary (shoulder) of the mother substrate. The use of the blade described above makes it possible to cut the mother substrate and, at the same time, form the inclined surface at the boundary (shoulder) via only one cutting stroke, thereby improving productivity.

The positional relation between the thin portion, the thick portion and the inclined portion can be adjusted to cut a portion of the mother substrate which becomes the boundary (shoulder) between the electrode arrangement surface and the cut end surface by the inclined portion of the blade to form an inclined surface before completely cutting the substrate via the thin portion of the blade, to cut the boundary (shoulder) of the mother substrate via the inclined portion of the blade after completely cutting the mother substrate via the thin portion of the blade, or cut the mother substrate and form the inclined surface at substantially the same time.

In accordance with a further aspect of preferred embodiments of the present invention, there is provided a method of manufacturing an electronic component in which a mother substrate having an electrode surface covered with a coating material is cut along predetermined cutting lines to produce electronic components, each of which has an electrode that is exposed at the cut end surface, the method including the steps of forming a groove in the surface of the mother substrate along each of the predetermined cutting lines using a blade having a shape in which the central portion of the peripheral surface in the depthwise direction projects so that the projecting central tip functions as a breaking groove forming portion for forming breaking grooves in the mother substrate thereby breaking the mother substrate, and an inclined portion adjacent to the projecting central tip functions as an inclined surface forming portion for cutting a portion of the mother substrate which becomes the boundary (shoulder) between the electrode arrangement surface and the cut end surface to form an inclined surface in the portion which becomes the boundary (shoulder), and in which the angle θ1 formed by two surfaces of the central tip is smaller than the angle θ2 formed by two surfaces of the inclined surface forming portion, to form the breaking grooves in the surface of the mother substrate and, at the same time, form the inclined surface at the portion which becomes the boundary (shoulder) between the electrode arrangement surface and the cut end surface; and then breaking the mother substrate along the breaking grooves to obtain an electronic component having an electrode that is partially exposed at the inclined surface.

In this method, the groove is formed in the surface of the mother substrate along each of the cutting lines by using the blade including the projecting central tip functioning as the breaking groove forming portion for forming the breaking grooves in the mother substrate, and the inclined portion adjacent to the central tip functioning as the inclined surface forming portion for forming the inclined surface by cutting the boundary (shoulder) of the mother substrate, the angle θ1 formed by two surfaces of the central tip being smaller than the angle θ2 formed by two surfaces of the inclined surface forming portion. Therefore, it is possible to easily and securely form the breaking grooves and the inclined surfaces in the surface of the mother substrate, and securely obtain each electronic component having an electrode which is exposed at the inclined surfaces by breaking the mother substrate along the breaking grooves.

In forming the grooves using the blade, the depth (the vertical distance between the surface of the mother substrate and the bottom of the groove) of each of the grooves is preferably in the range of about 10% to about 30% of the thickness of the mother substrate. This is because with a groove depth of less than about 10% of the thickness of the mother substrate, the mother substrate cannot be easily broken along the grooves, thereby causing oblique breaking. Also, with a groove depth of greater than about 30% of the thickness of the mother substrate, cracks which are not required for the later steps undesirable occur.

The method of manufacturing an electronic component of the preferred embodiments of the present invention uses a blade including an inner member made of a material suitable for cutting the mother substrate and having a tip projecting to contact the mother substrate before other portions of the blade contact the mother substrate, and outer members made of a material suitable for cutting the coating material and holding the inner member therebetween from both sides thereof.

The blade preferably includes the two members having the inner member and the outer member which are made of materials suitable for cutting the mother substrate and the coating material, respectively. Therefore, it is possible to cut the mother substrate by the inner member while suppressing occurrence of chipping or the like, and cut the coating material such as an insulating protective film or the like by the outer members without leaving chips of the coating material, thereby making the method of preferred embodiments of the present invention more effective.

In other words, in a conventional dicing technique, as shown in FIG. 10, the mother substrate 53 is cut along cutting lines A and B which are perpendicular to each other. However, in some cases, for example, the mother substrate is primarily cut along the cutting lines A, and then each of the stick-shaped mother substrates 53a is secondarily cut along the cutting lines B to obtain respective components 54.

In such cases, during the secondary cutting step, a dicing blade contacts the end of the substrate (the end of each of the stick-shaped substrates 53a obtained by primary cutting). At this time, a dicing blade 57 first contacts the insulating protective film 52 to cut it at the end of each of the stick-shaped mother substrates 53a, as shown in FIG. 12. Since the insulating protective film 52 has flexibility and the ability to stretch or elongate as compared with the material which constitutes the substrate, and fine chipping easily occur at the end of each of the mother substrates 53a, chips of the insulating protective film 52 are generated at the end of the substrate due to elongation and retraction of the insulating protective film 52, and such chips remain in each of the elements 54.

A product having chips of the insulating protective film which remain on the substrate has poor appearance and a defect in a set product after packaging of a complete product.

However, as in the method of manufacturing an electronic component in accordance with preferred embodiments of the present invention, the blade having the two members including the inner member made of a material suitable for cutting the mother substrate, and the outer member made of a material suitable for cutting the coating material is used for efficiently preventing the remainder of chips of the coating material such as the insulating protective film or the like, and avoiding the occurrence of a poor appearance and a disadvantage in a set product after packaging.

The blade may be made of, for example, a material including diamond particles of #600 to #1000 and a metallic binder. As the material suitable for cutting the coating material, for example, a material composed of diamond particles of #200 to #600 and a metallic binder can be used. However, the materials which constitute the blade are not limited to these materials, and various known materials can be used. Other features, elements and advantages of the present invention will become apparent from the following description of the invention which refers to the accompanying drawings.

DETAILED DESCRIPTION OF PREFERRED EMBODIMENTS

A first preferred embodiment relates to a method of manufacturing a chip type coil component having a structure in which a thin film coil pattern (conductor pattern) and a connecting electrode for connection with an external electronic component are disposed on the surface of a substrate, and the surface having the thin film coil pattern and the connecting electrode disposed thereon is coated with an insulating protective film (coating material). The preferred embodiments of the present invention can be applied to substrates of electronic components which are made of various materials such as glass, glass ceramics, composite mica ceramics, ferrite and the like.

Figure 1A:
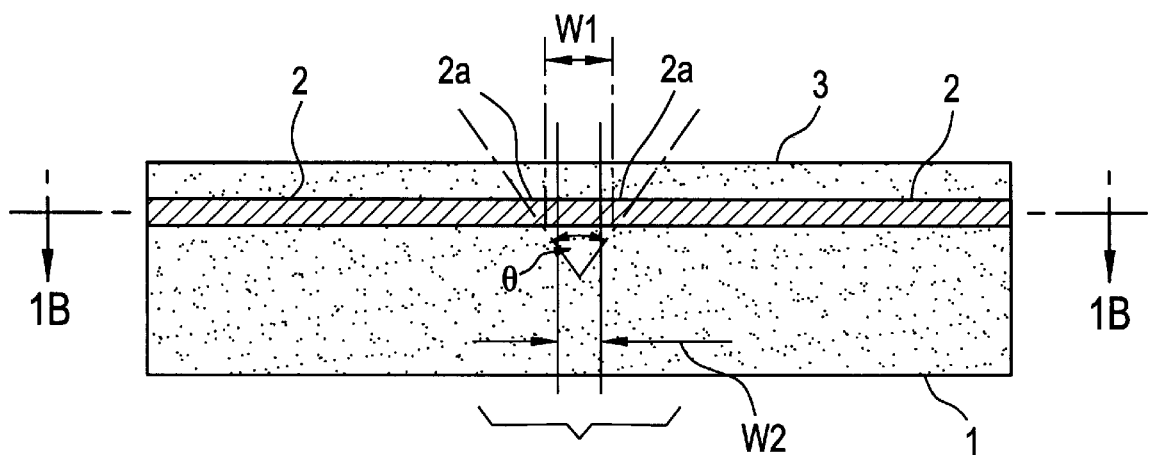
FIG. 1A is a front sectional view of a principal portion of a mother substrate formed in a step of a method of manufacturing an electronic component in accordance with a preferred embodiment of the present invention.
Figure 1B:
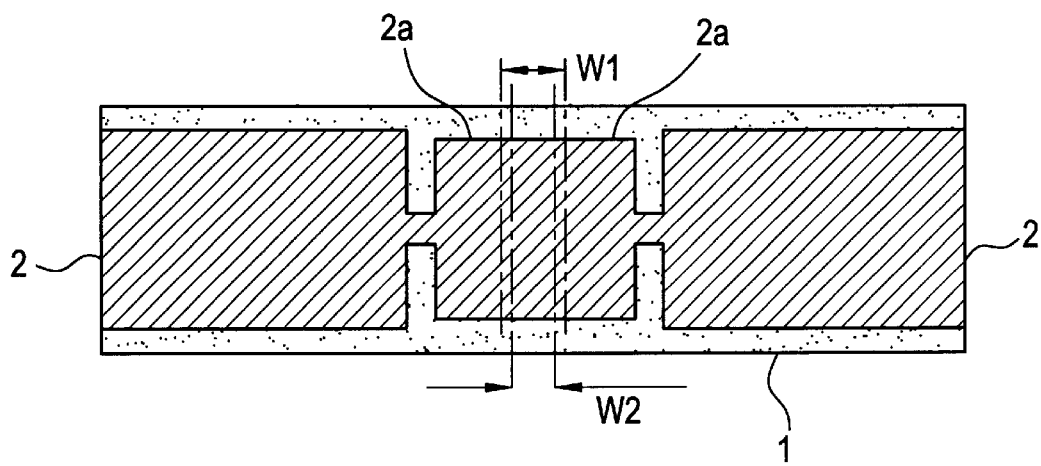
FIG. 1B is a sectional view taken along line B—B in FIG. 1A of a principal portion of a mother substrate formed in a step of a method of manufacturing an electronic component in accordance with preferred embodiment of the present invention.

As shown in FIGS. 1A and 1B, a thin film coil pattern (in a broad sense, an electrode) 2 including a connecting electrode 2a is formed, and an insulating protective film 3 for protecting the thin film coil pattern 2 is then formed on the surface of the mother substrate 1 upon which the thin film coil pattern 2 is disposed.

Then, substantially V-shaped grooves 12 (FIGS. 2 and 3) are formed in the surface of the mother substrate 1 as described below, and the mother substrate 1 is cut into respective electronic components.

Figure 2:
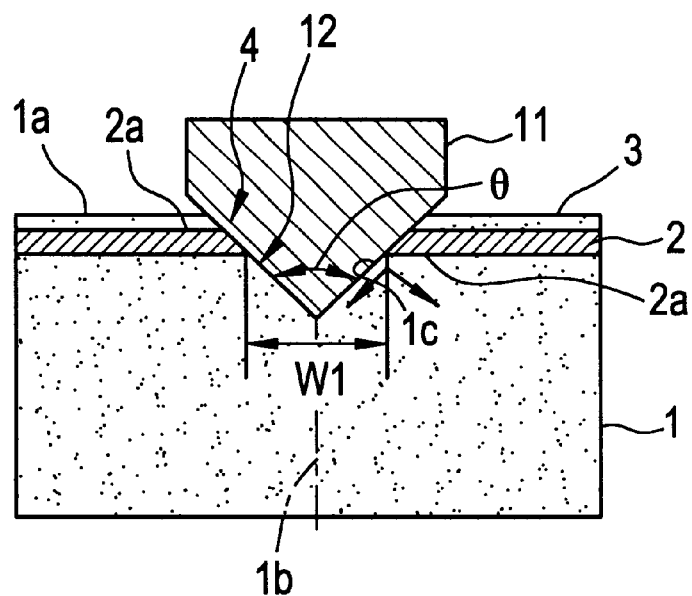
FIG. 2 is a drawing showing a state in which a groove is formed in a mother substrate in a step of a method of manufacturing a electronic component in accordance with a preferred embodiment of the present invention.

In forming a groove 12, as shown in FIG. 2, the substantially V-shaped groove 12 having a width W1 is formed in the surface of the mother substrate 1 using a blade 11 having a shape in which a central portion of the peripheral surface in the thickness direction projects in an angular form and has an inclined shape on two surfaces thereof. The width W1 represents the width of the groove formed in the substrate directly below the electrode (connecting electrode 2a).

The material used to form the blade 11 preferably includes a metallic binder and diamond particles. The material used to form the blade 11 may include, for example, the metallic binder and diamond particles having a particle size of #200 to #1200, and more preferably #600 to #1000.

The angle θ formed by two surfaces of the tip of the blade 11 is preferably within a range of about 75° to about 120°. The reason for preferably setting the angle θ formed by two surfaces of the tip of the blade 11 to about 75° to about 120° is that with an excessively small angle θ, the width (cutting width) of the groove 12 is stabilized, but the effect of relieving the impact on the substrate is insufficient, and with an excessively large angle θ, the width (cutting width) of the groove 12 greatly varies according to variations in the thickness of the mother substrate 1, thereby causing difficulties in achieving stability and control of the cutting process.

Figure 3:
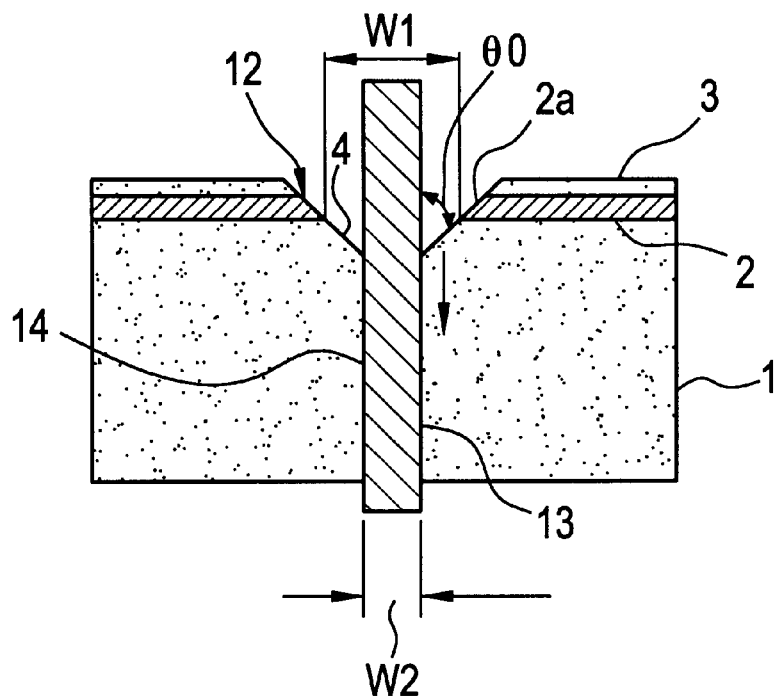
FIG. 3 is a drawing showing a state in which a mother substrate having a groove formed therein is cut in a step of a method of manufacturing an electronic component in accordance with a preferred embodiment of the present invention.

The mother substrate 1 having the groove 12 formed as described above is then cut along the center of the substantially V-shaped groove 12 by using a dicing blade 13 having a width (thickness) W2 smaller than the width W1 of the groove 12, as shown in FIG. 3. The width (thickness) W2 of the dicing blade 13 is preferably set to a value which allows a portion of the inclined surface of the substrate below the connecting electrode 2a to remain after the cutting is completed.

Figure 4:
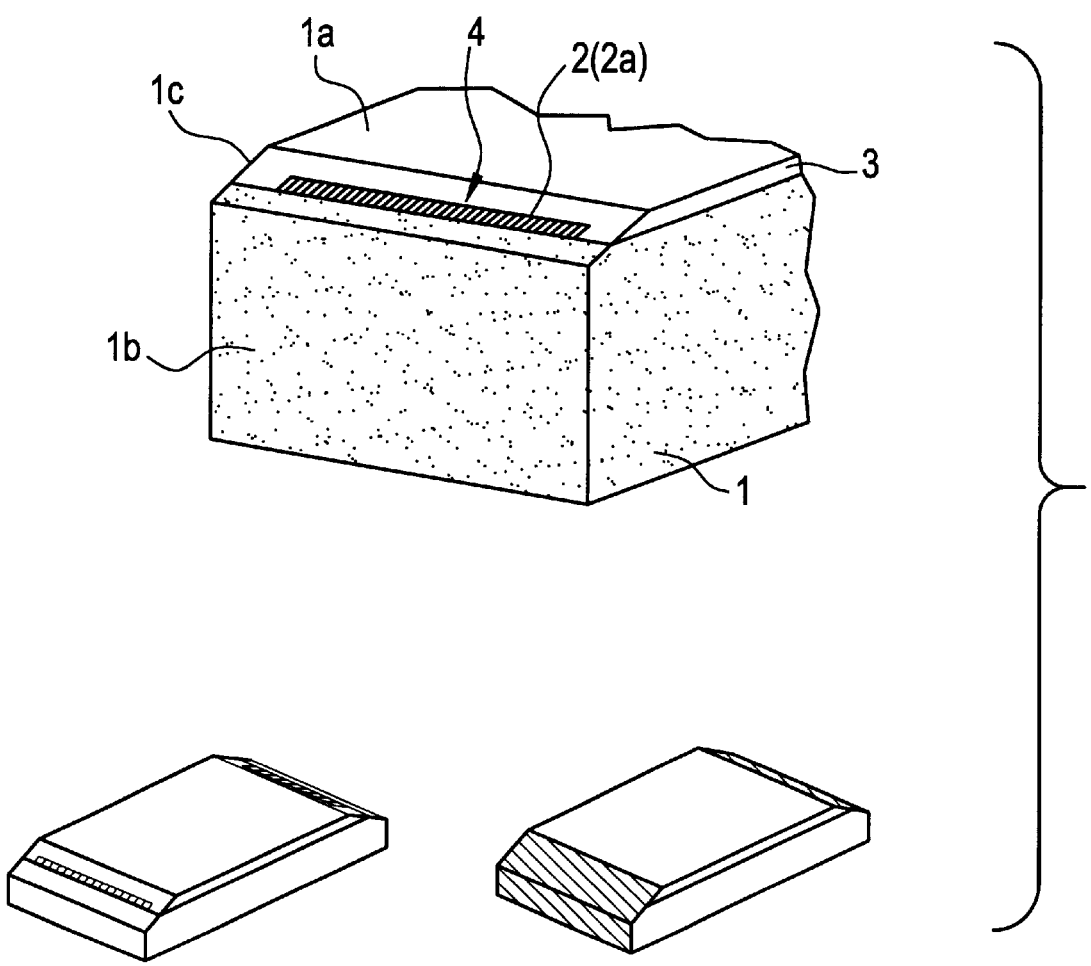
FIG. 4 is a perspective view showing an element obtained by cutting a mother substrate in a step of a method of manufacturing an electronic component in accordance with a preferred embodiment of the present invention.

As a result, an electronic component (chip type coil component) is obtained in which the inclined surface 4 is formed at a boundary (shoulder) between the surface 1a on which the electrode 2 is disposed and the cut end surface (vertical cut surface) 1b of the mother substrate 1, and the connecting electrode 2a is exposed at the inclined surface 4, as shown in FIG. 4.

A terminal electrode is disposed at either end of the component 1 and is connected to the connecting electrode 2a by means such as a thin film forming method such as sputtering or the like, coating conductive paste, baking or the like to complete the electronic component.

In this preferred embodiment, the mother substrate 1 is cut along the substantially V-shaped groove 12 by using the dicing blade 13 having a width (thickness) W2 smaller than the width W1 of the groove 12. Therefore, it is possible to reliably provide a portion of the inclined surface 4 at the boundary (shoulder) 1c where the electrode is exposed, and increase the exposure area of the electrode, as compared with a conventional case in which no inclined surface is formed at the boundary (shoulder). If the angle formed by the inclined surface 4 where the connecting electrode 2a is exposed and the vertical cut surface 1b is θ0 (θ/2) (FIG. 3), the area of the surface where the connecting electrode 2a is exposed is enlarged by 1/cos θ0 (>1) times a conventional case in which no oblique processing is performed.

As described above, oblique processing of the connecting electrode increases the exposed area of the electrode, and provides for smooth and reliable connection between the surface where the connecting electrode is exposed and the substrate material surrounding it, thereby improving electrical connectability between the connecting electrode 2a and an external terminal and characteristics such as Q of inductance.

Since the blade 11 has a sharp tip for oblique cutting, the impact applied to the substrate directly below the connecting electrode is low during cutting, and the occurrence of chipping and cracking can be substantially eliminated, as compared with a conventional case where the substrate is cut by using a dicing blade having a flat peripheral surface.

In oblique cutting, since the amount of cutting is small, and the cutting resistance is low, it is possible to cut the substrate by using a blade composed of smaller diamond particles, and thus improve the surface state (surface roughness) of the substrate near the connecting electrode 2a.

In this preferred embodiment, since the mother substrate 1 is cut by using the dicing blade 13 after the groove 12 is formed, the substrate material directly below the connecting electrode 2a has previously obliquely been cut in the step of forming the groove 12, and thus the mother substrate 1 is not initially cut by the dicing blade 13. Also, since the dicing blade 13 used has the thickness W2 which allows a portion of the inclined surface of the substrate below the connecting electrode 2a to remain after cutting of the mother substrate 1, if chipping or cracking occurs, no chipping occurs in the substrate directly below the connecting electrode 2a, thereby providing high reliability.

Since the connecting electrode is exposed at the inclined surface, it is possible to form the external terminal electrode on upper and lower sides of an electronic component by sputtering or the like which is capable of forming a precise pattern to thereby improve characteristics of the electronic component.

Figure 5:
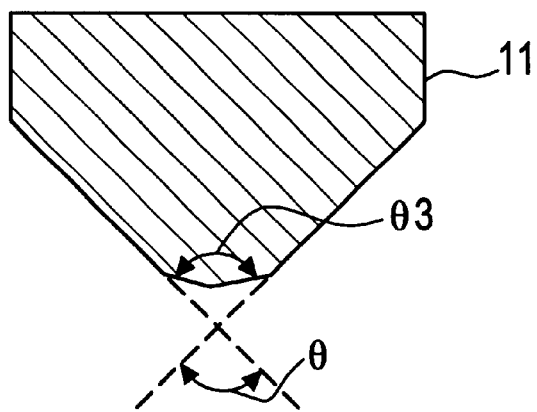
FIG. 5 is a drawing showing a modified example of the blade used in a method of manufacturing an electronic component in accordance with a preferred embodiment of the present invention.

The shape and angle of the blade 11 are not particularly limited except for the portion for forming the inclined surface 4, as shown in FIG. 5.

Figure 6:
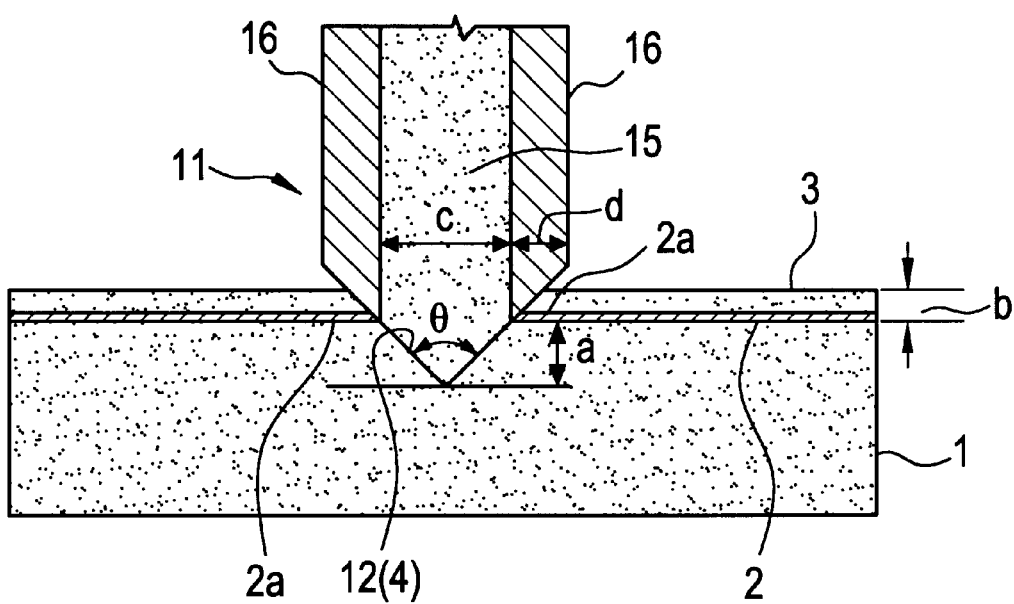
FIG. 6 is a drawing showing the structure of the blade used in a method of manufacturing an electronic component in accordance with another preferred embodiment of the present invention.

In a second preferred embodiment, the blade 11 used for forming the groove 12 in the mother substrate 1 has a structure in which an inner member 15 includes a tip which projects so as to contact the insulating protective film 3 coating the surface of the mother substrate 1 before the other portions of the blade 11 contact the film 3. The tip of the inner member 15 of the blade 11 is located between outer members 16 disposed on both sides thereof as shown in FIG. 6.

The inner member 15 and the outer members 16 are preferably made of materials suitable for cutting the mother substrate 1 and the insulating protective film 3, respectively.

For example, each of the inner member 15 and the outer members 16 may be formed of a material including a metallic binder and diamond particles having a predetermined particle size.

A material including diamond particles having a small particle size (for example, diamond particles of #600 to #1000) suitable for cutting the mother substrate 1 is preferably used for the inner member 15, and a material including diamond particles having a large particle size (for example, diamond particles of #200 to #600) suitable for cutting the insulating protective film 3 is preferably used for the outer members 16.

By using the blade 11 having the above structure, it is possible to cut the mother substrate 1 via the inner member 15 while preventing the occurrence of chipping or other undesired phenomenon. Thus, it is possible to efficiently cut the insulating protective film 3 via the outer members 16 while preventing any chips of the insulating protective film 3 from remaining on the substrate so as to securely form the substantially V-shaped grooves 12 in the surface of the mother substrate 1.

In the second preferred embodiment, besides the above-mentioned advantages achieved, the same advantages achieved in the first preferred embodiment are also achieved.

If the depth of the groove 12 is $a$, the total thickness of the insulating protective film 3 and the electrode (connecting electrode) 2a is $b$, the angle formed by two surfaces of the tip of the blade 11 is $\theta$, the thickness of the inner member 15 is $c$, and the thickness of the outer member 16 is $d$, the thickness $c$ of the inner member 15 is defined by the following equation:

$$c = 2a \tan(\theta/2); \text{ and}$$

the thickness $d$ of the outer member 16 is defined by the following equation:

$$d > b \tan(\theta/2).$$

After the groove 12 has been formed, for example, as in the first preferred embodiment, the mother substrate 1 can be divided into respective components by dice cutting.

Figure 7:
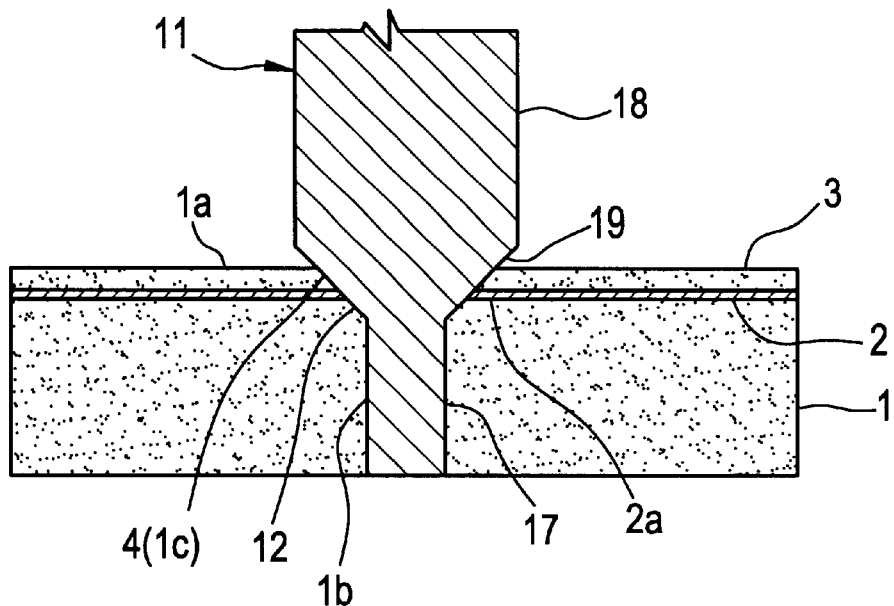
FIG. 7 is a drawing showing the structure of the blade used in a method of manufacturing an electronic component in accordance with a further preferred embodiment of the present invention.

In the third preferred embodiment, the blade 11 for forming the groove 12 in the mother substrate 1 and cutting the mother substrate 1 preferably is a substantially disk-shaped blade (dicing blade) 11. The blade 11 preferably includes a relatively thin portion 17 having a small thickness and located at an outer periphery of the blade at a location which is outside of a predetermined position in a radial direction of the blade. The blade 11 also includes a relatively thick portion 18 having a large thickness and located closer to a central portion of the blade 11 than the relatively thin portion 17. Further, the blade 11 includes an inclined portion 19 located at the boundary between the thin portion 17 and the thick portion 18, as shown in FIG. 7. The blade 11, for example, may be formed of a material including a metallic binder and diamond particles having a particle size of #200 to #1200, and more preferably #600 to #1000.

By using the blade 11 having the relatively thin portion 17, the relatively thick portion 18 and the inclined portion 19 located at the boundary therebetween, it is possible to securely cut the mother substrate 1 via the thin portion 17, and cut the boundary (shoulder) 1c between the surface 1a where the electrode 2 is disposed and the cut end surface 1b of the mother substrate 1 via the inclined portion 19 to securely form the inclined surface 4 in the boundary (shoulder) 1c, thereby making the preferred embodiments of the present invention more effective. By using the blade 11 according to the third preferred embodiment, it is possible to cut the mother substrate and, at the same time, form the inclined surface at the boundary (shoulder) via a one-stroke cutting operation to thereby improve productivity.

In addition to the advantages described above, the third preferred embodiment also achieves the same advantages as achieved in the first preferred embodiment.

The positional relationship between the relatively thin portion 17, the relatively thick portion 18 and the inclined portion 19 can be controlled to form the inclined surface 4 by cutting a portion of the mother substrate 1 which becomes the boundary (shoulder) 1c via the inclined portion 19 before completely cutting the mother substrate 1 via the thin portion 17, to form the inclined surface 4 by cutting the boundary (shoulder) 1c of the mother substrate 1 via the inclined portion 19 after completely cutting the mother substrate 1 via the thin portion 17, or cut the mother substrate 1 and form the inclined surface 4 at the same time.

In the fourth preferred embodiment, the blade 11 used has a shape in which the tip 21 at the approximate center of the peripheral surface in the thickness direction projects so that the projecting central tip 21 functions as a break groove forming portion for forming a break groove 12a in the mother substrate 1 and for breaking the mother substrate 1, and the inclined portion 23 adjacent to the central tip 21 functions as an inclined surface forming portion for cutting a portion of the mother substrate 1 which becomes the boundary (shoulder) 1c between the surface 1a where the electrode 2 is disposed and the cut end surface 1b to form the inclined surface 4 in the portion which becomes the boundary (shoulder) 1c, and in which the angle θ1 formed by two surfaces of the central tip 21 is smaller than the angle θ2 formed by two surfaces of the inclined surface forming portion (adjacent inclined portion) 23. The blade 11, for example, may be formed of a material including a metallic binder and diamond particles having a particle size of #200 to #1200, and more preferably #600 to #1000.

In the blade 11, the angle θ1 formed by two surfaces of the central tip 21 is preferably in the range of about 60° to about 90°, and the angle θ2 formed by two surfaces of the inclined surface forming portion (adjacent inclined portion) 23 is preferably in the range of about 75° to about 120°. The angle θ1 is preferably in the range of about 60° to about 90° is that with θ1 of less than about 60°, wearing of the blade 11 is significantly increased, and stable cutting is difficult. If θ1 is greater of over about 90°, the force applied for breaking is not concentrated on the center, and thus stable division cannot be performed. The angle θ2 formed by two surfaces of the inclined surface forming portion (adjacent inclined portion) 23 is preferably in the range of about 75° to about 120° because with θ2 of less than about 75°, the width (cut width) of the groove 12 is stabilized, but the effect of relieving the impact on the mother substrate 1 is insufficient, and with θ2 of about 120°, the width (cut width) of the groove 12 significantly varies with variations in the thickness of the mother substrate 1, and thus stable control of the width is difficult.

Figure 8:
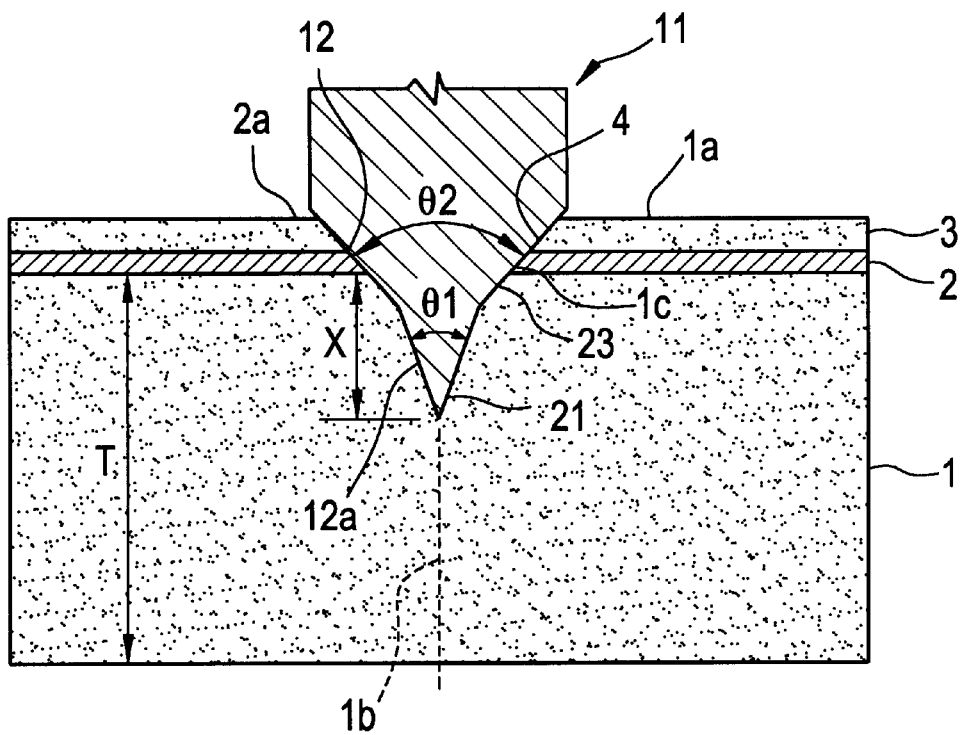
FIG. 8 is a drawing showing the structure of the blade used in a method of manufacturing an electronic component in accordance with a still further preferred embodiment of the present invention.
Figure 9:
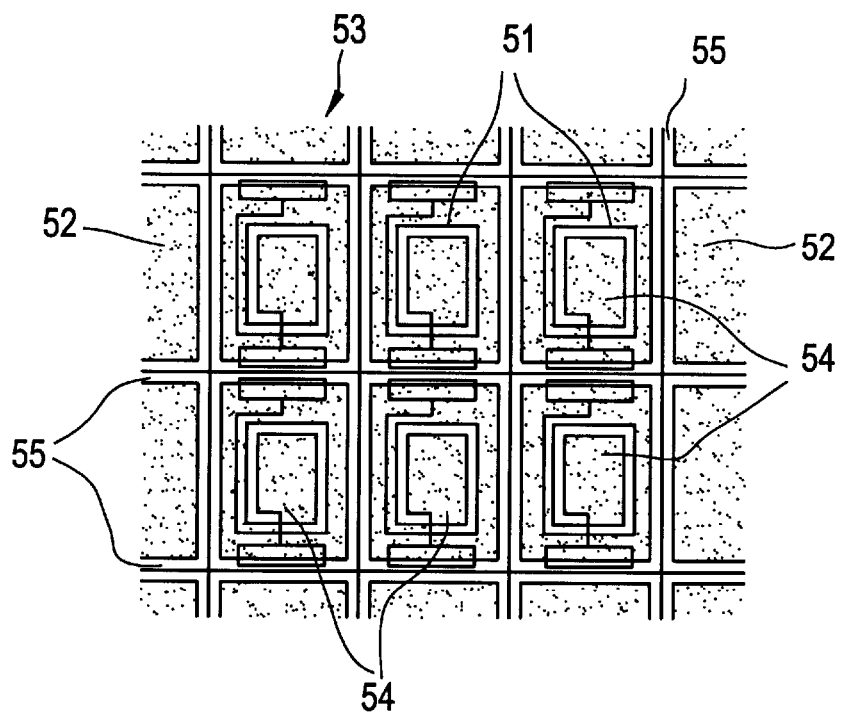
FIG. 9 is a drawing showing a mother substrate formed by a conventional method of manufacturing an electronic component.
Figure 10:
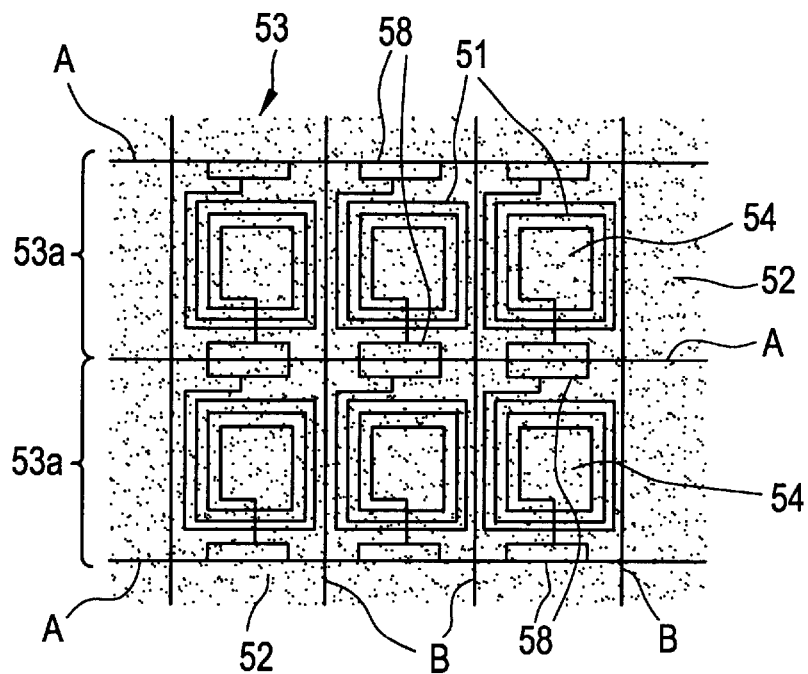
FIG. 10 is a drawing showing a mother substrate formed by another conventional method of manufacturing an electronic component.
Figure 11A:
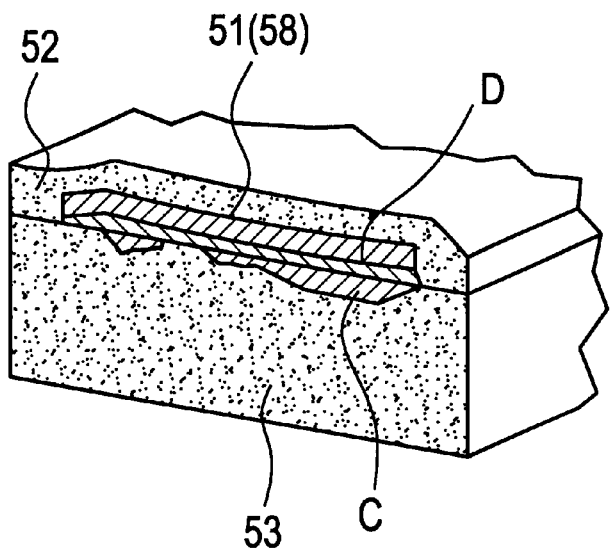
FIG. 11A is a schematic drawing showing a state where chipping occurs during dice cutting of a mother substrate having a surface coated with an insulating protective film in which conductor patterns are arranged, in a conventional method of manufacturing an electronic component.
Figure 11B:
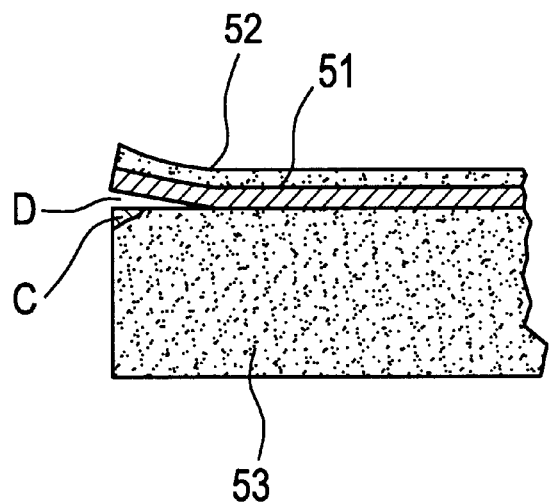
FIG. 11B is a schematic drawing showing a state where peeling occurs during dice cutting of a mother substrate having a surface coated with an insulating protective film in which conductor patterns are arranged, in a conventional method of manufacturing an electronic component.
Figure 12:
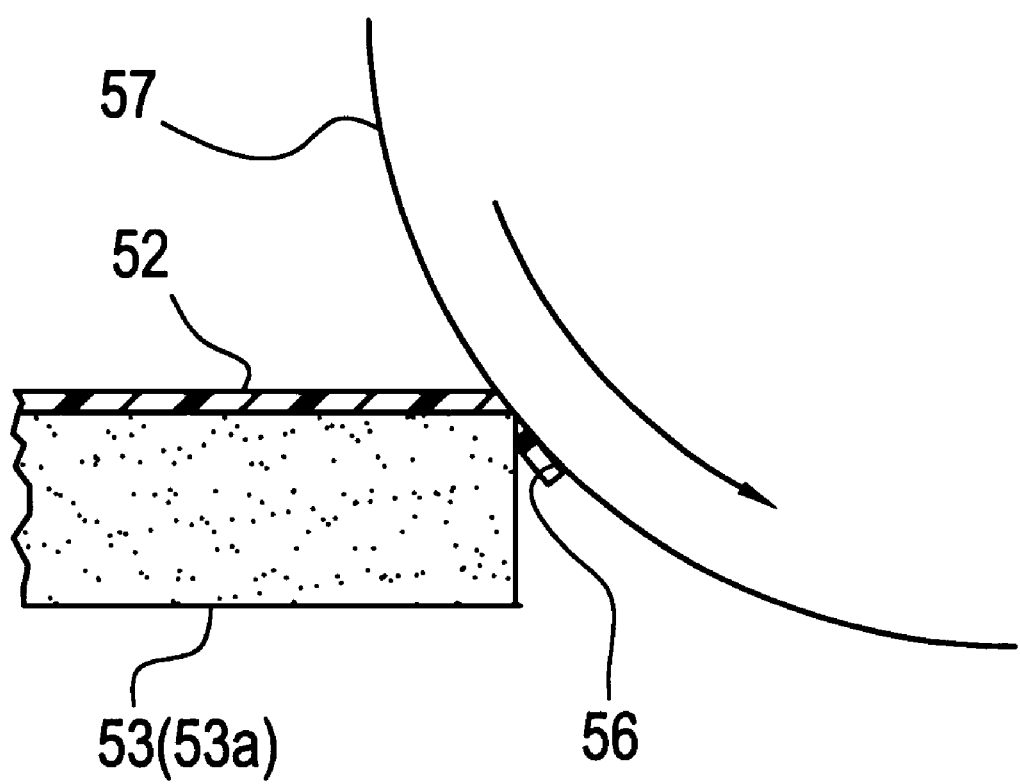
FIG. 12 is a drawing showing a state where a mother substrate is cut in a step of a conventional method of manufacturing an electronic component.

In forming the groove 12 by using the blade 11 of this preferred embodiment, the depth X (FIG. 8) of the groove 12 is in the range of about 10% to about 30% of the thickness T of the mother substrate 1. This is because with a depth X of less than about 10% of the thickness of the mother substrate 1, it is difficult to divide the mother substrate 1 along the groove 12, and oblique division occurs, and with a depth X of over about 30% of the thickness of the mother substrate 1, cracks which are not required for the later steps undesirable occur. -

In forming the groove 12 in the surface of the mother substrate 1 along each of the predetermined cutting lines by using the blade 11, the break groove 12a and the inclined surface 4 can easily and securely be formed in the surface of the mother substrate 1. By breaking the mother substrate 1 along the break groove 12a, it is possible to easily obtain an element in which the electrode 2 (connecting electrode 2a) is partially exposed from the inclined surface 4. It is thus possible to increase the exposure area of the connecting electrode 2 to improve the electrical connectability with an external terminal and improve characteristics such as Q of inductance.

In the fourth preferred embodiment, besides the above effect, the same effect as that obtained in the first embodiment can be obtained.

Although, in each of the above preferred embodiments, a case in which a tip type coil component is manufactured is described as an example, the present invention can also be applied to not only the tip type coil component but also various electronic components in which the surface is coated with a coating material such as an insulating protective film or the like.

Although, in each of the above preferred embodiments, a case in which the insulating protective film is formed on only one side of the mother substrate has been described, the present invention can also be applied to cases in which the insulating protective film is formed on both sides of the mother substrate.

The present invention is not limited to the above preferred embodiments with respect to other points, and various applications and modifications can be made within the scope of the present invention.

As described above, the method of manufacturing an electronic component of preferred embodiments of the present invention includes the steps of cutting at least a portion of a mother substrate by using a blade having a shape in which a portion of the blade which is butted against the boundary (shoulder) of the mother substrate between the electrode arrangement surface and the cut end surface or a portion which becomes the boundary (shoulder), is inclined so as to form an inclined surface at the boundary (shoulder) or the portion which becomes the boundary (shoulder) and so as to expose a portion of the electrode at the inclined surface. It is thus possible to increase the exposure area of the electrode to improve electrical connectability with an external terminal and improve characteristics such as Q of inductance, as compared with conventional methods in which no inclined surface is formed at the boundary (shoulder).

The method of manufacturing an electronic component of preferred embodiments of the present invention may include step of cutting a portion of a mother substrate which becomes the boundary (shoulder) between the electrode arrangement surface and the cut end surface by using a blade having a shape in which a portion of the blade which is butted against the portion of the mother substrate which becomes the boundary (shoulder) is inclined at a predetermined angle before cutting the mother substrate along cutting lines to form a groove along each of the cutting lines, so as to form an inclined surface at the portion of the mother substrate which becomes the boundary (shoulder) and to expose a portion of an electrode at the inclined surface, and then cutting the mother substrate along the cutting lines so as to allow at least a portion of the inclined surface where the electrode is exposed to remain. It is thus possible to increase the exposure area of the electrode, improve electrical connectability with an external terminal and improve characteristics such as Q of inductance, as compared with conventional methods in which no inclined surface is formed at the boundary (shoulder).

Also, the method of manufacturing an electronic component of preferred embodiments of the present invention may include the step of cutting a mother substrate along cutting lines and then forming an inclined surface at the boundary (shoulder) of the mother substrate between the electrode arrangement surface and the cut end surface by using a blade having a shape in which a portion of the blade which is butted against the boundary (shoulder) between the electrode arrangement surface and the cut end surface is inclined, so as to expose a portion of an electrode at the inclined surface. It is thus possible to increase the exposure area of the electrode, improve electrical connectability with an external terminal and improve characteristics such as Q of inductance, as compared with conventional methods in which no inclined surface is formed at the boundary (shoulder).

In the method of manufacturing an electronic component of preferred embodiments of the present invention, the use of a dicing blade for cutting the mother substrate permits the maximum utilization of the surface of the substrate and makes the preferred embodiments of the present invention more effective.

The method of manufacturing an electronic component of preferred embodiments of the present invention may use a dicing blade including a thin portion, a thick portion and an inclined portion formed at the boundary therebetween so that the mother substrate can be cut by the thin portion, and the boundary (shoulder) of the mother substrate between the electrode arrangement surface and the cut end surface can be cut by the inclined surface to securely form an inclined surface at the boundary (shoulder). The use of the blade permits cutting of the mother substrate and the formation of the inclined surface at the boundary (shoulder) at the same time by simply performing a single cutting stroke with such a unique blade, thereby improving productivity.

Further, the method of manufacturing an electronic component of preferred embodiments of the present invention may include the step of forming a groove in the surface of a mother substrate along each of predetermined cutting lines by using a blade having a projecting central tip functioning as a break groove forming portion for forming a break groove in the mother substrate, and an inclined portion adjacent to the central tip, which functions as an inclined surface forming portion for forming an inclined surface at the boundary (shoulder) of the mother substrate by cutting the mother substrate, in which the angle θ1 formed by two surfaces of the central tip is smaller than the angle θ2 formed by two surfaces of the inclined surface forming portion. It is thus possible to effectively form the break groove and the inclined surface in the surface of the mother substrate, thereby improving productivity.

Further, the method of manufacturing an electronic component of preferred embodiments of the present invention may use a blade including two types of members including an inner member and an outer member, wherein the inner member is made of a material suitable for cutting a mother substrate, and the outer member is made of a material suitable for cutting a coating material. It is thus possible to cut the mother substrate via the inner member while suppressing the occurrence of chipping or the like, and cut a coating material such as an insulating protective film via the outer member without leaving chips of the coating material, thereby making preferred embodiments of the present invention more effective.

While the invention has been described with respect to particular illustrative preferred embodiments thereof, it is to be understood that the present invention is not limited to the above described embodiments and that various applications and modifications may be made without departing from the spirit and scope of the invention.

What is claimed is:

1. A method of manufacturing an electronic component comprising the steps of:
   providing a mother substrate made of a ceramic material;
   forming an electrode arrangement on said mother substrate;
   forming an insulative coating material to cover said electrode arrangement; and
   cutting said coating material, said electrode arrangement and said mother substrate using a blade having a shape in which a portion of the blade that is arranged to contact a boundary of the mother substrate between the electrode arrangement surface and a cut end surface of the substrate is inclined so as to form an inclined surface at the boundary and so as to expose a portion of the electrode at the inclined surface.

2. A method of manufacturing an electronic component according to claim 1, wherein the mother substrate is cut by using a dicing blade.

3. A method of manufacturing an electronic component according to claim 1, wherein said step of cutting further comprises using a dicing blade having a substantially disk shape comprising a relatively thin portion having a small thickness and located at an outer peripheral portion of the blade outside of a predetermined position along a radial direction of the blade, a relatively thick portion having a larger thickness than the thin portion and located closer to a central portion of the blade than the relatively thin portion, and an inclined portion located at a boundary between the relatively thin portion and the relatively thick portion, so that the mother substrate is cut via the relatively thin portion, and the boundary of the mother substrate is cut via the inclined portion of the blade to form an inclined surface at the boundary.

4. A method of manufacturing an electronic component according to claim 1, wherein said step of cutting further comprises using a blade comprising an inner member having a tip which projects so as to contact the mother substrate before other portions of the blade contact the mother substrate, and an outer member surrounding the inner member at both sides thereof, wherein the inner member is made of a material suitable for cutting the mother substrate, and the outer member is made of a material suitable for cutting the coating material.

5. A method of manufacturing an electronic component comprising the steps of:
   providing a mother substrate made of a ceramic material;
   forming an electrode arrangement on said mother substrate:
   forming an insulative coating material to cover said electrode arrangement:
   forming a groove by cutting said coating material, said electrode arrangement and said mother substrate along each of a plurality of cutting lines using a blade having a shape in which a portion thereof arranged to contact a portion of the mother substrate which becomes a boundary between the electrode arrangement surface and a cut end surface of the mother substrate formed after cutting is inclined at a predetermined angle to form an inclined surface at the portion of the mother substrate which becomes the boundary between the electrode arrangement surface and the cut end surface and so as to expose a portion of the electrode at the inclined surface before cutting the mother substrate along the cutting lines; and
   cutting the mother substrate along the cutting lines so as to allow at least a portion of the inclined surface where the electrode is exposed to remain.

6. A method of manufacturing an electronic component according to claim 5, wherein the mother substrate is cut by using a dicing blade.

7. A method of manufacturing an electronic component according to claim 5, wherein said step of cutting further comprises using a dicing blade having a substantially disk shape comprising a relatively thin portion having a small thickness and located at an outer peripheral portion of the blade outside of a predetermined position along a radial direction of the blade, a relatively thick portion having a larger thickness than the thin portion and located closer to a central portion of the blade than the relatively thin portion, and an inclined portion located at a boundary between the relatively thin portion and the relatively thick portion, so that the mother substrate is cut via the relatively thin portion, and the boundary of the mother substrate is cut via the inclined portion of the blade to form an inclined surface at the boundary.

8. A method of manufacturing an electronic component according to claim 5, wherein said step of cutting further comprises using a blade comprising an inner member having a tip which projects so as to contact the mother substrate before other portions of the blade contact the mother substrate, and an outer member surrounding the inner member at both sides thereof, wherein the inner member is made of a material suitable for cutting the mother substrate, and the outer member is made of a material suitable for cutting the coating material.

9. A method of manufacturing an electronic component comprising the steps of:

providing a mother substrate made of a ceramic material;

forming an electrode arrangement on said mother substrate;

forming an insulative coating material to cover said electrode arrangement;

cutting said coating material, said electrode arrangement, and the mother substrate along a plurality of cutting lines; and forming an inclined surface at a boundary of the mother substrate between the electrode arrangement surface and a cut end surface thereof by using a blade having a shape in which a portion thereof which is arranged to contact the boundary of the mother substrate between the electrode arrangement surface and the cut end surface thereof is inclined so as to expose a portion of the electrode at the inclined surface.

10. A method of manufacturing an electronic component according to claim 9, wherein the mother substrate is cut by using a dicing blade.

11. A method of manufacturing an electronic component according to claim 9, wherein said step of cutting further comprises using a dicing blade having a substantially disk shape comprising a relatively thin portion having a small thickness and located at an outer peripheral portion of the blade outside of a predetermined position along a radial direction of the blade, a relatively thick portion having a larger thickness than the thin portion and located closer to a central portion of the blade than the relatively thin portion, and an inclined portion located at a boundary between the relatively thin portion and the relatively thick portion, so that the mother substrate is cut via the relatively thin portion, and the boundary of the mother substrate is cut via the inclined portion of the blade to form an inclined surface at the boundary.

12. A method of manufacturing an electronic component according to claim 9, wherein said step of cutting further comprises using a blade comprising an inner member having a tip which projects so as to contact the mother substrate before other portions of the blade contact the mother substrate, and an outer member surrounding the inner member at both sides thereof, wherein the inner member is made of a material suitable for cutting the mother substrate, and the outer member is made of a material suitable for cutting the coating material.

13. A method of manufacturing an electronic component comprising the steps of:

providing a mother substrate having an electrode arrangement surface coated with a coating material;

forming a groove in the surface of the mother substrate along a plurality of cutting lines by using a blade having a shape in which a central portion of an outer peripheral surface projects in a thickness direction so that a projecting central tip having substantially straight side edges functions as a break groove forming portion of the blade for forming a break groove in the mother substrate used for breaking the mother substrate, and an adjacent inclined substantially straight edge portion which is adjacent to the central tip is arranged to function as an inclined surface forming portion for cutting a portion of the mother substrate which becomes a boundary between the electrode arrangement surface and the cut end surface thereof to form an inclined surface at the portion of the mother substrate which becomes the boundary and such that a portion of the electrode is exposed at the inclined surface, and in which an angle $\theta_1$ formed by two surfaces of the central tip is smaller than an angle $\theta_2$ formed by two surfaces of the inclined surface forming portion, to form the break groove in the surface of the mother substrate and, at the same time, to form an inclined surface in the portion of the substrate which becomes the boundary between the electrode arrangement surface and the cut end surface; and breaking the mother substrate along the break groove to obtain an electronic component in which said portion of the electrode is exposed at the inclined surface.

14. A method of manufacturing an electronic component according to claim 13, wherein the mother substrate is cut by using a dicing blade.

15. A method of manufacturing an electronic component according to claim 13, wherein said step of cutting further comprises using a dicing blade having a substantially disk shape comprising a relatively thin portion having a small thickness and located at an outer peripheral portion of the blade outside of a predetermined position along a radial direction of the blade, a relatively thick portion having a larger thickness than the thin portion and located closer to a central portion of the blade than the relatively thin portion, and an inclined portion located at a boundary between the relatively thin portion and the relatively thick portion, so that the mother substrate is cut via the relatively thin portion, and the boundary of the mother substrate is cut via the inclined portion of the blade to form an inclined surface at the boundary.

16. A method of manufacturing an electronic component according to claim 13, wherein said step of cutting further comprises using a blade composing an inner member having a tip which projects so as to contact the mother substrate before other portions of the blade contact the mother substrate, and an outer member surrounding the inner member at both sides thereof, wherein the inner member is made of a material suitable for cutting the mother substrate, and the outer member is made of a material suitable for cutting the coating material.

* * * * *